(12) United States Patent
Rhinow et al.

(10) Patent No.: US 12,535,729 B2
(45) Date of Patent: Jan. 27, 2026

(54) METHOD AND APPARATUS FOR MASK REPAIR

(71) Applicant: Carl Zeiss SMT GmbH, Oberkochen (DE)

(72) Inventors: Daniel Rhinow, Frankfurt am Main (DE); Christian Felix Hermanns, Frankfurt am Main (DE); Johann-Christoph Von Saldern, Jena (DE); Hubertus Marbach, Grossostheim (DE); Nicole Auth, Ginsheim-Gustavsburg (DE); Bartholomaeus Szafranek, Ober-Ramstadt (DE); Christian Preischl, Mainz (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 487 days.

(21) Appl. No.: 18/107,043

(22) Filed: Feb. 8, 2023

(65) Prior Publication Data

US 2023/0280647 A1    Sep. 7, 2023

(30) Foreign Application Priority Data

Mar. 1, 2022  (DE) .......................... 102022202058.8

(51) Int. Cl.
*G03F 1/74*  (2012.01)
*C01B 21/06*  (2006.01)
(Continued)

(52) U.S. Cl.
CPC .............. *G03F 1/74* (2013.01); *C01B 21/062* (2013.01); *H01J 37/28* (2013.01);
(Continued)

(58) Field of Classification Search
CPC ..... G03F 1/74; G03F 1/72; G03F 1/82; C01B 21/062; H01J 37/28; H01J 37/3178;
(Continued)

(56) References Cited

U.S. PATENT DOCUMENTS

| 5,429,730 A | 7/1995 | Nakamura et al. |
| 5,955,223 A | 9/1999 | Mitsui et al. |

(Continued)

FOREIGN PATENT DOCUMENTS

| CN | 102437510 | 5/2012 | ............... H01S 5/30 |
| CN | 110462521 | 11/2019 | ............... G03F 7/20 |

(Continued)

OTHER PUBLICATIONS

Office Action issued by the Korean Patent Office for Application No. KR 10-2023-0026606 dated Mar. 7, 2025 (with English Translation).

(Continued)

*Primary Examiner* — Caleen O Sullivan
(74) *Attorney, Agent, or Firm* — Fish & Richardson P.C.

(57) ABSTRACT

The present invention pertains to methods, apparatuses and computer programs for processing an object for lithography. A method for processing an object for lithography comprises: (a) providing a first gas; (b) providing a second gas, the second gas including second molecules capable of performing an inversion oscillation; (c) providing a particle beam in a working region of the object for production of a deposition material in the working region based at least partly on the first gas and the second gas. The second gas is provided with a gas flow rate of less than 5 sccm, preferably less than 2 sccm, more preferably less than 0.5 sccm.

30 Claims, 5 Drawing Sheets

(51) Int. Cl.
*H01J 37/28* (2006.01)
*H01J 37/317* (2006.01)
*H01L 21/027* (2006.01)

(52) U.S. Cl.
CPC ...... *H01J 37/3178* (2013.01); *H01L 21/0274* (2013.01); *H01J 2237/006* (2013.01); *H01J 2237/31794* (2013.01)

(58) Field of Classification Search
CPC ....... H01J 2237/006; H01J 2237/31794; H01J 2237/31735; H01J 2237/31744; H01L 21/0274; C23C 16/047; C23C 16/34; C23C 14/30; C23C 14/06; C23C 14/0641
USPC .......................................................... 430/5
See application file for complete search history.

(56) References Cited

U.S. PATENT DOCUMENTS

| | | | |
|---|---|---|---|
| 2005/0016462 A1 | 1/2005 | Yamazaki | |
| 2011/0084207 A1* | 4/2011 | Zhang | H01J 37/3005 250/397 |
| 2014/0255831 A1 | 9/2014 | Hofmann et al. | |
| 2016/0111269 A1 | 4/2016 | Fedosenko et al. | |
| 2018/0267411 A1 | 9/2018 | Srivastava et al. | |
| 2019/0296521 A1 | 9/2019 | Yun | |
| 2020/0103751 A1 | 4/2020 | Budach et al. | |
| 2022/0011682 A1 | 1/2022 | Edinger et al. | |
| 2023/0185180 A1 | 6/2023 | Tu et al. | |

FOREIGN PATENT DOCUMENTS

| | | | |
|---|---|---|---|
| CN | 111786260 | 10/2020 | ............. H01S 5/343 |
| DE | 102013203995 | 9/2014 | ........... H01L 21/027 |
| DE | 102018217025 | 10/2019 | .............. G03F 1/84 |
| JP | 2002-088478 | 3/2002 | ............. C23D 16/48 |
| JP | 2012-230148 | 11/2012 | ............... G03F 1/72 |
| JP | 2014-174552 | 9/2014 | ............... G03F 1/74 |
| JP | 2023-537352 | 8/2023 | ............... G03F 1/74 |
| KR | 1020140110747 | 9/2014 | ........... H01L 21/027 |
| KR | 1020220006477 | 1/2022 | ............... G03F 1/72 |
| TW | 200415952 | 8/2004 | ............. G05B 33/10 |
| WO | WO 97/04360 | 6/1997 | ............... G03F 1/08 |

OTHER PUBLICATIONS

The Office Action issued by the German Patent Office for Application No. DE 10 2022 202 058.8, dated Sep. 27, 2022 (with English Machine Translation).

The Office Action issued by the Japanese Patent Office for Application No. JP 2023-031299, dated Aug. 15, 2024 (English Machine Translation).

The Office Action and Search Report issued by the Taiwan Patent Office for Application No. TW 112107031 Dated Dec. 6, 2023 (English Translation Only).

The Office Action issued by the German Patent Office for Application No. DE 10 2022 202 058.8, dated Nov. 4, 2024 (with English Translation).

* cited by examiner

METHOD AND APPARATUS FOR MASK REPAIR

CROSS-REFERENCE TO RELATED APPLICATIONS

The present patent application claims the priority of the German patent application DE 10 2022 202058.8, entitled "Verfahren and Vorrichtung zur Maskenreparatur," filed on Mar. 1, 2022, which is incorporated by reference in its entirety.

TECHNICAL FIELD

The present invention relates to methods, to an apparatus and to a computer program for processing of an object for lithography. More particularly, the present invention relates to a method of producing a deposition material, to a method of passivating a surface material, to a corresponding apparatus and to a method of lithographic processing of a wafer, and to a computer program for performing the methods.

BACKGROUND

In the semiconductor industry, increasingly smaller structures are produced on a wafer in order to ensure an increase in integration density. Among the methods used here for the production of the structures are lithographic methods, which image these structures onto the wafer. The lithographic methods may comprise, for example, photolithography, ultraviolet (UV) lithography, DUV lithography (i.e. lithography in the deep ultraviolet spectral region), EUV lithography (i.e. lithography in the extreme ultraviolet spectral region), x-ray lithography, nanoimprint lithography, etc. Masks are usually used here as objects for lithography (e.g. photomasks, exposure masks, reticles, stamps in the case of nanoimprint lithography, etc.), which comprise a pattern in order to image the desired structures onto a wafer, for example.

As the integration density increases, so do the demands in respect of the mask production (e.g., as a result of the accompanying reduction in the structure dimensions on the mask or as a result of the greater material requirements in lithography). Consequently, the production processes for masks become increasingly more complex, more time-consuming and more expensive, but it is not always possible to avoid mask errors (e.g. defects, lack of material, malformed material, etc.). Typically, the mask errors are therefore remedied or repaired in a further processing operation.

For example, it is possible to repair a mask error via a particle beam-based or particle beam-induced deposition process. This may typically comprise an electron beam- or ion beam-induced deposition of a material on a local site in the region of the mask error. It is possible here to use a deposition gas as precursor gas, which is crucial in defining the composition of the deposited material (i.e. the repair material).

A (repaired) mask may, however, be subject to high physical and also chemical stresses in lithography and in downstream processes (for example during the exposure of a mask, a mask cleaning operation, etc.). Therefore, the strength, durability and stability of the repair material with respect to these aggressive influences is of high significance.

It is known, for example, that an additive gas can be added to the deposition gas in the mask processing operation, which can additionally influence the properties of the repair material.

Further, US 2020/0103751 A1 discloses deposition of a material using a first particle beam and at least one deposition gas. The deposition gas may comprise a metal carbonyl, which may include chromium hexacarbonyl. The deposition gas may typically be used in order to replace missing pieces of a pattern element of a photomask. In addition, it is possible to add at least one additive gas comprising an oxidizing agent to the deposition gas, in which case the oxidizing agent may comprise, for example, oxygen, water vapor or nitrogen dioxide. In addition, the additive gas may comprise a gas having a reducing effect. The gas having the reducing effect may comprise hydrogen, ammonia or methane. Also disclosed is an EUV mask. One possible material for a buffer layer of the EUV mask is chromium nitride. The buffer layer is deposited on a capping layer, and the capping layer protects a multilayer structure of the EUV mask. One possible material for an absorption layer of the EUV mask is chromium. One possible material for an antireflection layer of the EUV mask is tantalum oxynitride. Also disclosed is a structuring, such that structures of absorbing pattern elements are produced, formed from the buffer layer, the absorption layer and the antireflection layer.

On account of the technical complexity of the particle beam-based deposition process, however, the properties of the repair material are not always optimal.

The problem addressed by the present invention is therefore that of specifying methods and apparatuses that optimize the processing of objects for lithography.

SUMMARY

This object is at least partly achieved by the various aspects of the present invention.

A first aspect of the invention relates to a method of processing an object for lithography. The method comprises providing a first gas and providing a second gas, the second gas including second molecules capable of performing an inversion oscillation. The method further comprises providing a particle beam in a working region of the object for production of a deposition material in the working region based at least partly on the first gas and the second gas. The second gas may be provided with a gas flow rate of less than 5 sccm, preferably less than 2 sccm, more preferably less than 0.5 sccm.

The inventive concept is based firstly on the fact that the inversion oscillation of a molecule can have a crucial influence on the production of the deposition material using a particle beam. The inversion oscillation of the molecule may, for example, comprise a pyramidal inversion of the molecule (wherein the pyramidal inversion may, for example, also be termed umbrella inversion). Molecules capable of performing an inversion oscillation are also referred to herein as inversion molecules. The invention makes use of the fact that inversion molecules can have an average dipole moment $\mu$ over time of zero. The inversion oscillation causes the integral of the dipole moment $\mu$ of an inversion molecule to comprise essentially zero over a particular time interval (for example, the integral of the dipole moment $\mu$ may be zero over a time interval comprising one or more vibration periods; or it may mathematically tend towards zero when the time interval chosen tends to infinity). This mechanism may therefore have the result that inversion molecules have a reduced dipole character, by comparison with molecules incapable of performing an inversion oscillation. It was recognized here that this reduced dipole character of inversion molecules can have a crucial influence on the interaction of the inversion molecules with a material surface. In the production of the deposition material, a complex interaction may take place between the first gas, the second gas and particle beam, in which the deposition material is produced on a material surface within the working region of the object for lithography. For example, the production of the deposition material may comprise a particle beam-induced deposition (for example via a beam of particles of non-zero mass). For the production of the deposition material, therefore, properties including those of the gases within the working region and in the environment of the object are of crucial importance. These (local) properties of the gases may include a (local) gas concentration of the gases within the working region or in the environment of the object. The (local) gas concentration may comprise, for example, the concentration of the first gas, of the second gas and/or of gaseous reaction products of the production of the deposition material. In addition, the (local) gas concentration may comprise the concentration of various molecules (e.g. a concentration of the second molecules, a concentration of further molecules, encompassed in the first gas, the second gas and/or the reaction products). In addition, the (local) gas concentration described here may comprise any gas parameter associated with the first gas, the second gas and/or the gaseous reaction products (e.g. gas pressure, gas flow rate, etc.).

In the production of the deposition material, a defined (local) gas concentration is typically required over a particular period, in order to allow the reaction for production of the deposition material to proceed in a controlled manner, which enables the establishment of defined physical and/or chemical properties of the deposition material. It may therefore be helpful to control the defined (local) gas concentration. The defined (local) gas concentration may be of a static or dynamic type. What is comprehended here by a static (local) gas concentration may be that an essentially constant (local) gas concentration may be present or is to be established (for example a constant ratio of the concentrations of the first gas, the second gas and/or the reaction products). What is comprehended here by a dynamic (local) gas concentration may be that a dynamic process of (local) gas concentration is to be effected in a controlled manner (e.g. controlled outward transport of reaction products, controlled switching between two static (local) gas concentrations, alternating (local) gas concentrations etc.).

On account of chemical and/or physical interactions in the production of the deposition material, however, the defined (local) gas concentration may vary to a technically undesirable degree. For example, this may comprise (local) depletion of the second gas (and/or of the first gas) within the working region, such that the process of producing the deposition material is influenced in an unwanted manner.

The inventors have recognized here that the use of inversion molecules that can have the reduced dipole character described herein can be extremely advantageous in the case of particle beam-based production of a deposition material. This is because the reduced dipole character of inversion molecules can affect the probability of absorption of the inversion molecules with respect to a material within the working region. As a result of the reduced dipole character, for example, a probability of absorption of the second molecules (i.e. of the inversion molecules) of the second gas can take on an advantageous degree compared to a material within the working region. This advantageous degree of probability of absorption cannot be achieved, for example, with molecules incapable of performing an inversion oscillation. These molecules that are incapable of performing an inversion oscillation are referred to herein as non-inversion molecules. Non-inversion molecules may, for example, have a non-zero permanent dipole moment. Non-inversion molecules may also include, for example, polar molecules (for example NO, $NO_2$, $H_2O$) that have a non-zero dipole moment. In particular, inversion molecules, on account of the reduced dipole character, may have a lower degree of probability of absorption with respect to a material (within the working region) than non-inversion molecules. Inversion molecules may therefore be absorbed less well by the material (within the working region) than non-inversion molecules. It is thus possible, when using inversion molecules in the second gas, to minimize the depletion of the second gas in the region of the working region. The concentration of the second gas may thus, for example, be more elevated within the working region, or be maintained for longer, than in the case of (exclusive) use of non-inversion molecules in the second gas. Technical readjustment of the concentration of the second gas or consideration of the decline in concentration of the second gas on account of a high degree of probability of absorption can thus be significantly minimized.

The use of inversion molecules as second molecules can accordingly enable optimized ratios in the configuration of the defined (local) gas concentration in the production of the deposition material, as a result of which it is possible to optimize the production of the deposition material. In addition, this can optimize the establishment of the defined physical and/or chemical properties of the deposition material produced, since these can depend to a crucial degree on the (local) gas concentration in the production of the deposition material.

The ability of the second molecules to perform an inversion oscillation may be defined in that the second molecules are fundamentally capable of performing an inversion oscillation at a particular temperature comprising a temperature greater than zero kelvin (e.g., without requiring any further energetic excitation to perform an inversion oscillation). For example, this may be defined in that the second molecules of the second gas are capable of performing an inversion oscillation at a temperature that prevails during the production of the deposition material. For example, the second molecules may perform inversion oscillations during the temperature that prevails during the production of the deposition material (without requiring any specific excitation to perform the inversion oscillation at that temperature). For example, the particular temperature at which the second molecules are capable of performing an inversion oscillation may comprise a typical room temperature (e.g. 20° C. or 25° C.). The particular temperature may also be within a temperature range between −60° C. and 600° C., which may prevail, for example, in the production of the deposition material. Notably, the second molecules may perform inversion oscillations at the herein described particular temperatures (without requiring any further excitation to perform the inversion oscillation).

Further, the inventors have found, in a test series, an advantageous parameter space of the gas flow rate of the second gas (comprising the inversion molecules) for production of the deposition material. The second gas can be provided with a gas flow rate of less than 5 sccm (where sccm stands for standard cubic centimeters per minute). In addition, the second gas may be provided with a gas flow rate of preferably less than 2 sccm, more preferably less than 0.5 sccm. In a further example, the second gas can be provided with a gas flow rate of less than 0.3 sccm. Within these ranges, it is possible, for example, to deposit a material having particular stability to outside influences (e.g. irradiation with UV, DUV, EUV radiation under reduced pressure, use in a reactive gas atmosphere, cleaning cycles of an EUV or DUV mask, etc.).

The interplay of the gas flow rate specified here and the interaction of the inversion molecules with a material (within the working region) that has been elucidated herein was able to give rise to particularly preferred properties of the deposition material produced. One property may, for example, be the composition of material. For example, it is possible by use of Auger electron spectroscopy and/or x-ray photoelectron spectroscopy (abbreviation: XPS) to enable a determination of the chemical composition of the material produced.

The inventors have recognized here that an optimum of the chemical composition of the deposition material can be found within the ranges mentioned. Advantageous properties may alternatively relate to the durability of the deposition material. For example, the deposition material may essentially withstand a particular number of cleaning cycles (for example of an EUV or DUV mask) (for example, a clear defect repaired by use of the deposition material essentially cannot print after this number of cleaning cycles), for example at least 10, at least 50 or at least 100 or even at least 1000 cleaning cycles.

In principle, however, there are also conceivable examples comprising provision of the second gas with a different gas flow rate, e.g. <0.01 sccm or >5 sccm. Particularly advantageous deposition material may then, for example, alternatively or additionally be produced via further aspects described herein. Correspondingly, a method of depositing chromium nitride or chromium nitride-comprising material may be considered to be one aspect of the invention, in which a particle beam and a first and second gas as described herein in general terms are used (without being limited to a particular gas flow rate interval). The first gas may be chromium-containing. The second gas may include second molecules capable of performing an inversion oscillation.

Irrespective of that, it should be made clear that the expression sccm relates to the unit standard cubic centimeters per minute, which is known to the person skilled in the art. It indicates the flow rate in units of volume per unit time, where the volume units correspond to those under standard conditions (temperature T=0° C., pressure p=1013.25 hPa). The standard densities known to the person skilled in the art can be used to calculate, for example, the mass flow rate required for a particular gas flow rate at different pressures or temperatures (for example in kg per minute). For example, the standard density of air is, for instance, about 1.29 mg/cm$^3$, and that of $NH_3$ is, for instance, about 0.77 mg/cm$^3$.

The method may further comprise the local providing of the first gas and/or the second gas in the working region of the object. The first and/or second gas may thus be directed locally onto the working region for the production of the deposition material (for example via a gas conduit, a nozzle, etc.). The method may further comprise the local production of the deposition material within the working region of the object for lithography, such that the production is limited essentially to the working region. The method may also include the use of a localized particle beam, for example a focused particle beam, in which case the producing comprises local producing limited essentially to a region of the localized particle beam.

The object for lithography as described herein may comprise a lithography mask. The lithography mask may be designed such that it can be used in lithography for the production of semiconductor-based chips (for example on exposure of a semiconductor-based wafer). The lithography mask may also include any type of lithography mask that can image an image based on a source of electromagnetic radiation (of any wavelength) and a pattern encompassed in the lithography mask. The image may comprise a transformation of the pattern. The lithography mask may comprise, for example, an EUV mask, a DUV mask, an x-ray lithography mask, a binary mask, a phase-shifting mask, etc. In addition, the lithography mask may also comprise a nanoimprint lithography stamp, or a lithography mask, that can image a pattern based on a source of particles.

The working region specified herein may comprise a local region of the object for lithography. However, it is also conceivable that the working region comprises the entire object for lithography. The working region may also include any areal dimension, shape and/or geometry. For example, the working region may be within an order of magnitude associated with a (critical) dimension of the object. For example, the (critical) dimension may comprise a particular dimension CD of a pattern element of the object. The working region may cover, for example, an area A that arises from the particular dimension CD (for example, A may be proportional to the particular dimension CD, e.g. $A=CD^2$). In addition, the material can be produced within the working region such that the material produced does not necessarily cover the entire area of the working region, but is produced only in a subregion of the working region. Alternatively, the material can be produced within the working region such that the material produced covers the entire area of the working region.

In one example, the method comprises providing the second gas with a gas flow rate of less than 0.01 sccm, preferably less than 0.05 sccm, more preferably less than 0.1 sccm. These minimum amounts permit particularly advantageous stability of the deposited material.

Further, the method may comprise providing the second gas with a gas flow rate between 0.1 sccm and 0.5 sccm, more preferably 0.2 sccm to 0.3 sccm, most preferably 0.24 sccm to 0.26 sccm. It has been found that a particularly advantageous stability of the deposited material can be achieved within these ranges.

In one example, the method comprises providing the particle beam with a dwell time of the particle beam of at least 0.1 µs, preferably at least 0.3 µs, most preferably at least 0.5 µs. In one example, the method comprises providing the particle beam with a dwell time of the particle beam of at least 1 µs, preferably at least 3 µs, most preferably at least 5 µs. In a further example, the process comprises providing the particle beam with a dwell time of the particle beam of 0.1 µs to 10 µs, preferably 0.3 µs to 7 µs, most preferably 0.4 µs to 6 µs. In order to deposit the material with a desired height, multiple cycles are run with this dwell time.

In one example, the method comprises providing the first gas and/or the second gas in such a way that the deposition material at least partly forms in a gas phase without the influence of the particle beam. The inventive use of inversion molecules in the second gas can ensure a higher concentration of the second gas in the environment of the working region of the object compared to the use of non-inversion molecules (as described herein). This state can therefore enable reaction between the first gas and the second gas even without the influence of the particle beam. Thus, it is possible to significantly increase the probability that the deposition material will form over a surface of the working material even in the gas phase. This may give rise, for example, to an advantageous boundary condition for the reactions during the particle beam-induced production of the deposition material. On activation of the particle beam, it is thus possible for the production of the deposition material in the form of a deposition of the deposition material within the working region to take place in a favored manner to make it more efficient. The state described may also be promoted by controlled adjustment of a gas parameter of the first gas and/or the second gas (for example via corresponding gas flow rates, gas concentrations, gas pressures etc. of the first and/or second gas).

In one example, the method comprises providing the second gas such that a reaction product of the production of the material is displaced from the working region. This can be enabled, for example, through the use of the inversion molecules as second molecules. As described herein, a high concentration of the second gas in the environment of the working region of the object can be assured compared to use of non-inversion molecules. The resulting high supply of second molecules in the gas phase can increase the probability of displacement of the reaction products from the surface of the working region.

In one example, the first gas may be regarded as a main deposition gas for the production of the deposition material. The first gas here may be designed such that it has a substantial influence on a metal content in the deposition material produced. In one example, the first gas in the method includes first molecules comprising a metal atom. In this example, therefore, the first gas (as main deposition gas) can influence the process of producing the deposition material in such a way that it defines whether the deposition material comprises a particular metal. Further, the first gas (as main deposition gas) may define whether the deposition material comprises a particular composite metal.

The second gas described herein may be regarded in this context as additive gas in relation to the main deposition gas (i.e. the first gas). The second gas, as additive gas, may additionally adapt the chemical composition and the physical properties of the deposition material (for example its stoichiometry, hardness, chemical stability, etc.). For example, the use of the second gas as additive gas may cause constituents of the second gas to be incorporated into the deposition material. Further, the use of the second gas may cause a molar proportion within the deposition material to be reduced (compared to exclusive use of the first gas for the production of the deposition material with a particle beam). The inventors have recognized here that an additive gas comprising inversion molecules, on account of the connections described herein, is especially advantageous over an additive gas comprising non-inversion molecules.

In one example, the method comprises providing the first gas and the second gas at least partly simultaneously. For example, the first gas and the second gas can be introduced simultaneously into the environment of the working region or into the environment of the object, for example during the production of the deposition material. This may also comprise the (at least partial) presence of a first gas flow rate of the first gas and of a second gas flow rate of the second gas during the production, such that the presence of both gases in the environment of the working region/object is assured. It is possible here, for example, that the first and second gas flow rates are essentially identical. In other examples, they may alternatively be different. The simultaneous provision of the first and second gases may also comprise variation of the first gas flow rate and of the second gas flow rate (in the production of the deposition material).

In one example, the method comprises providing the first gas and the second gas at least partly with a time interval. For example, it may be necessary for the production of the deposition material for only one of the two gases to be provided or introduced in the environment of the working region/object in a process step of producing. For example, it may be necessary for commencement of the production of the deposition material for the first gas only (or the second gas) to be introduced at first into the environment of the working region/object. Subsequently, the second gas (or the first gas) may be fed in or provided at a later juncture. Further, it is also conceivable that, during the production, there is stepwise alternation between the (exclusive) providing/introducing of the first gas (without the second gas) and the (exclusive) providing/introducing of the second gas (without the first gas). Furthermore, it is also possible that an end of the process of producing the deposition material comprises the exclusive providing/introducing of one of the two gases. For example, it is conceivable that an end of the process of producing is defined by the exclusive providing/introducing of the second gas.

In a further example, the first gas in the method includes first molecules comprising a carbonyl compound. This may also be interpreted in that the first molecules of the first gas have a carbonyl group. For example, the first molecules may comprise a carbon monoxide ligand.

In one example, the first molecules in the method comprise a metal carbonyl. For example, the metal carbonyl may comprise a complex of a metal with carbon monoxide as ligand. The metal carbonyl may in principle comprise any charge of a complex, any number and type of central atoms and any number and type of ligands and bonding modes thereof. For example, the metal carbonyl may include an uncharged complex, positively charged metal carbonyl cations and/or negatively charged metal carbonylate anions. The production of the deposition material may give rise to carbon monoxide molecules (i.e. CO molecules) as reaction products. In a further example, the first molecules in the method comprise an organometallic compound.

In one example, the metal carbonyl comprises a chromium carbonyl. For example, the chromium carbonyl may comprise chromium hexacarbonyl, $Cr(CO)_6$.

In one example, the deposition material produced comprises a chromium nitride. It has been found that this can achieve an exceptional durability of the deposition material. In a further example, the deposition material produced comprises a metal nitride and/or a metal oxynitride.

In one example, the chromium nitride (or the deposition material) in the method comprises at least 10 atomic percent of nitrogen, preferably at least 15 atomic percent of nitrogen, more preferably at least 20 atomic percent of nitrogen. The unit "atomic percent" may relate to a molar proportion of chromium nitride (or of the deposition material), where atomic percent indicates, for example, the relative number of particles (for example of nitrogen atoms) in relation to the total number of particles of the substance (e.g. total number of atoms in the chromium nitride, or total number of atoms in the deposition material). The atomic percentage may be detected, for example, via Auger electron spectroscopy and/or x-ray photoelectron spectroscopy (and also, for example, via photoelectron spectroscopy, PES).

In one example, the method comprises the producing of the deposition material in such a way that a defect of the object is remedied. For example, this may comprise firstly localizing the defect (for example via a scanning electron microscope, an optical microscope, etc.). It is possible here to define the working region which is used for the production of deposition material on the basis of at least one characteristic of the localized defect (for example based on a position, shape, size, type of defect, etc.). The remedying of the defect in the object may further comprise producing a repair shape encompassing the defect. In one example, the repair shape may serve as the working region for the method specified herein. The repair shape may have, for example, a pixel pattern, which can enable localization of a defect site. The pixel pattern may, for example, be designed such that it follows the outline of the defect, such that every pixel in the pixel pattern corresponds essentially to a site in the defect and hence constitutes a defect pixel. In another example, the pixel pattern has a fixed geometric shape (e.g. a polygon, a rectangle, a circle, etc.) which fully encompasses the defect, in which case not every pixel necessarily constitutes a defect site. It is possible here for the pixel pattern to include defect pixels corresponding to a defect site, and non-defect pixels corresponding to a site which does not cover part of the defect. In one example, the method comprises directing the particle beam at least onto a defect pixel of the pixel pattern of the repair shape in the producing of the material. Further, the particle beam may be configured such that it can be directed onto any defect pixel in the production of the deposition material. This can ensure that the production of the deposition material is locally restricted to the defect pixel and hence only the defect is processed.

In one example, the defect in the method comprises a clear defect. A clear defect here is a faulty site on the object for lithography that should actually be opaque according to the design of the object (e.g. impermeable or strongly absorbing for a radiation of a particular wavelength). In particular, opaque may be defined in relation to a lithography method for the object. For example, the object for lithography may comprise an EUV mask for an EUV lithography method, in which case "opaque" may refer to a radiation wavelength of 13.5 nanometers. It is also conceivable that "opaque" relates to a DUV lithography method (at a radiation wavelength, for example, of 193 nanometers or 248 nanometers), an i-line lithography method (at a radiation wavelength, for example, of 265 nanometers), or any other lithography method depending on the object. Further, a clear defect may comprise, for example, a faulty site at which material of an opaque pattern element of a lithographic mask is missing. The method here may comprise producing the deposition material such that the faulty site becomes opaque. For example, this may comprise producing an absorber material as deposition material by the method specified herein. The absorbent material here may be designed such that it is opaque with regard to the wavelength at which the pattern element is also opaque. The absorber material produced may correspond, for example, to a material of a layer of the pattern element or comprise a material composition having optically similar properties (e.g. refractive index n, coefficient of absorption k) to a material of a layer of the pattern element. In one example, an absorber material is deposited by the method specified herein, which includes a considerable portion of chromium nitride or includes essentially chromium nitride, in order to remedy the clear defect. Further, the method according to the invention may comprise producing a material of any layer of the pattern element by the method specified herein.

A second aspect of the invention relates to a method of processing a surface material of an object for lithography, comprising: providing a second gas, the second gas including second molecules capable of performing an inversion oscillation. The method in the second aspect further comprises providing a particle beam in a working region of the object for passivation of the surface material within the working region based at least partly on the second gas. The method in the second aspect may accordingly comprise particle beam-assisted or particle beam-induced passivation based at least partly on the second gas. The surface material may comprise any material included in the object for lithography. For example, the surface material may be a material in any structure and/or layer of a lithographic mask. For example, the surface material may also be present on the object.

Features that are described for the first aspect in this application may also be comprised by the second aspect. In particular, the second gas may be one which is described herein in relation to the first aspect. It is likewise possible for features that are described herein for the second aspect also to be comprised by the first aspect. Further, the first aspect may comprise the second aspect, and the second aspect may likewise comprise the first aspect.

The passivating of the surface material may be designed such that only a local site of the surface material on which the particle beam acts is passivated in the method of the second aspect. For example, the particle beam may be directed onto a local site of the surface material (for example via controlled deflection and/or focusing of the particle beam), such that the local site is passivated in combination with the second gas provided. The extent of the local site which is passivated may correspond, for example, to the extent of the particle beam on the surface; for example, the passivation may be effected within a site having a diameter proportional to the diameter of the particle beam (e.g. FWHM) on the surface (for example 5 times the diameter to 0.2 times the diameter or 2 to 0.5 times the diameter of the particle beam). The passivating of the surface material may accordingly be localized in any degree of freedom by the positioning of the particle beam. The surface material may thus be passivated locally (i.e. geometrically bounded) in a controlled manner. For example, in the context of the method in the second aspect, the particle beam may be scanned in a particular pattern along (the surface of) the surface material, as a result of which the surface material is passivated along this pattern. This is in contrast with a conventional global purely gas-based passivation in which a material (for example a material of the object for lithography) can be passivated solely over a large area (for example, in the case of a conventional purely gas-based passivation, the entire surface exposed to a gas is passivated). The method according to the invention thus enables a high degree of configuration of the geometry of the passivation or of the passivated sites, and also the controlled exclusion of sites that are not to be passivated (since, for example, only the sites scanned by the particle beam can be passivated via the method).

In one example, the passivating in the second aspect comprises the passivating of a lateral surface of the surface material. The lateral surface may comprise, for example, a local site/face of an edge, a corner, an elevation, a depression etc. of the surface material. The method according to the invention may accordingly enable the passivating of lateral sites on a material of the object for lithography that are typically difficult to access. It is possible here for the particle beam to be aligned onto the surface material at a sideways angle. It is also conceivable that, in the passivation of the lateral surface, the object (and hence the surface material) is angled/tilted, and also a combination of tilting of the object and lateral alignment of the particle beam. In a further example, the surface material in the invention comprises a material of a lateral surface of the object.

The passivating of the surface material may be designed such that the surface material becomes more physically and/or chemically stable to outside influences than without the passivation according to the invention. The passivation may especially be optimized with respect to the outside influences to which the object is exposed in the course of lithography processing (e.g. electromagnetic radiation, purge gases, cleaning chemicals, immersion media, etc.). The passivation may especially take place in an advantageous manner since the second molecules used are inversion molecules that promote configuration of a defined (local) gas concentration of the second gas within the working region (as described herein). Further, the passivation may especially serve to passivate reactive sites of structured lithography masks that can be attacked (preferentially) by process gases (e.g. edges, previously damaged structures, critical, easily damaged structures etc.). The passivating may especially be prophylactic in order to prevent any possible damage in advance.

In one example, in the method in the second aspect, the passivating assists an etching process. For example, during an etching process or in the course of an etching process (for example in the case of local etching in the region of the surface material), the surface material may be passivated (as described herein). The etching process may comprise, for example, the etching of chromium- and/or chromium oxide-containing absorber material. The etching gas used may, for example, be $XeF_2$ and $H_2O$. The edges that arise in the etching process may be regarded as the surface material described herein (or the lateral surface of the surface material). Accordingly, in the invention, the edges described herein may be passivated via the method in the second aspect. This can be effected, for example, after conclusion of the etching process for a fundamental (e.g. final) passivation of the surface material. It is additionally also conceivable that the passivation is effected in order to adjust the process speed of the etching process. The passivation here may be effected at least partly during the etching process.

In one example, the method in the second aspect further comprises producing the surface material in the working region, based at least partly on providing of a first gas and the particle beam before the passivation of the surface material. The first gas in the second aspect may correspond to one of the examples specified herein for the first gas in the first aspect of the invention. The method in the second aspect may further comprise controlled (e.g. particle beam-induced) deposition of the surface material, which can subsequently be passivated in accordance with the invention. For example, the passivating may immediately follow the production of the surface material, in which case it is also conceivable that the producing of the surface material and the passivating can be effected separately (for example as separate processing operations).

In a further example, the surface material may be produced by one of the methods in the first aspect described herein. In this case, the surface material in the second aspect may be similar to or correspond to the deposition material produced in the first aspect.

In a further example, the production of the surface material may also be based at least partly on an added gas. The added gas, in the production of the surface material, may be provided as an additive gas alongside the first gas. For example, the added gas may comprise an oxidizing agent, a halide and/or a gas having a reducing effect. The oxidizing agent may include an oxygen-containing gas. For example, the oxidizing agent may comprise at least one of the following: oxygen ($O_2$), ozone ($O_3$), water ($H_2O$), hydrogen peroxide ($H_2O_2$), dinitrogen monoxide ($N_2O$), nitrogen monoxide (NO), nitrogen dioxide ($NO_2$), nitric acid ($HNO_3$). The halide may include a halogen-containing gas. For example, the halide may comprise at least one of the following: $Cl_2$, HCl, $XeF_2$, HF, $I_2$, HI, $Br_2$, HBr, NOCl, $PCl_3$, $PCl_5$, $PF_3$. The gas having a reducing effect (e.g. a reducing agent) may comprise a hydrogen-containing gas. For example, the gas having a reducing effect may comprise at least one of the following: $H_2$, $NH_3$, $H_2N$—$NH_2$, $CH_4$. In one example, the producing of the surface material comprises the providing of a first gas including chromium hexacarbonyl, and the providing of an added gas including nitrogen dioxide as oxidizing agent. In a further example, the producing of the surface material comprises the providing of a first gas including chromium hexacarbonyl, and the providing of an added gas including water and/or oxygen as oxidizing agent.

In one example, in the method in the second aspect, the surface material comprises an absorber material. As described herein, the absorber material may be designed such that it is opaque with respect to the wavelength in the lithography method at which the object for lithography can be used.

In one example, in the method in the second aspect, the passivating comprises producing a passivation layer on the surface material. For example, the producing of the passivation layer may comprise chemical/physical variation of at least one upper layer of the surface material. Further, the producing of the passivation layer may comprise depositing the passivation layer as a further layer on the surface material. Further, it is also conceivable that a combination of varied upper layer of the surface material and a deposited further layer is produced in accordance with the invention on the surface material. In one example, in the method in the second aspect, the passivation layer produced comprises a nitride of the surface material.

In one example, in the method in the second aspect, the surface material produced comprises chromium. For example, the surface material that has been produced may be a chromium oxide-containing or chromium-containing material, the surface of which is passivated by nitride formation.

In one example, in the method in the second aspect, the passivation layer produced comprises a chromium nitride.

In one example, in the method in the second aspect, the passivating is followed by production of a further surface material on the passivated surface material. The further surface material may be produced analogously to the surface material (as described herein). Further, the method in the second aspect may comprise the passivating (as described herein) of the further surface material. In a further example, the method in the second aspect comprises alternating production of the further surface material and passivation thereof. The alternating production and passivation can be repeated here as often as desired. For example, this example may result in a layer stack in which there is alternation of a (further) surface material and the passivation layer thereof.

In one example, in the method in the second aspect, the chromium nitride comprises at least 10 atomic percent of nitrogen, preferably at least 15 atomic percent of nitrogen, more preferably at least 20 atomic percent of nitrogen.

In one example, the method in the second aspect comprises the producing of the surface material in such a way that a defect of the object is remedied. For example, this can be effected analogously to the examples described in the first aspect. In one example, in the method in the second aspect, the defect comprises a clear defect.

In one example, in the method in the first and/or second aspect, the inversion oscillation comprises a pyramidal inversion of the second molecules.

In one example, in the method in the first and/or second aspect, the second molecules comprise a trigonal-pyramidal geometry.

In one example, in the method in the first and/or second aspect, the second molecules comprise nitrogen and hydrogen in a chemical compound. For example, a second molecule may comprise essentially nitrogen and hydrogen. It is also conceivable that the second molecule comprises exclusively nitrogen and hydrogen.

In one example, in the method in the first and/or second aspect, the second molecules comprise ammonia, $NH_3$. For example, the inversion oscillation of ammonia takes place with a high frequency of about 23 gigahertz (GHz) at a typical room temperature. The inventors have recognized that this is advantageous for the method according to the invention.

In one example, in the method in the first and/or second aspect, the second molecules comprise $H_2N$—$NH_2$.

In one example, in the method in the first and/or second aspect, the second molecules comprise nitrogen and a halogen in a chemical compound. For example, a second molecule may comprise essentially nitrogen and a halogen. It is also conceivable that the second molecule comprises exclusively nitrogen and halogen.

In one example, in the method in the first and/or second aspect, the second molecules comprise at least one of the following molecules: $NF_3$, $NCl_3$, $NI_3$, $NBr_3$.

In one example, in the method in the first and/or second aspect, the second molecules comprise nitrogen, hydrogen and a halogen in a chemical compound. For example, a second molecule may comprise essentially nitrogen, hydrogen and a halogen. It is also conceivable that the second molecule comprises exclusively nitrogen, hydrogen and a halogen.

In one example, in the method in the first and/or second aspect, the second molecules comprise at least one of the following molecules: $NH_2X$ where X comprises a halogen; $NHX_2$ where X comprises a halogen.

In one example, in the method in the first and/or second aspect, the second molecules have a lower probability of absorption in the working region than $NO_2$ molecules. The lower probability of absorption can ensure better availability of the second molecules.

In one example, in the method in the first and/or second aspect, the particle beam comprises an electron beam. For example, the deposition material in the first aspect and/or the surface material in the second aspect can be produced via electron beam-induced deposition (known, for example, as (F)EBID—(focused) electron beam-induced deposition).

However, it is also conceivable that the particle beam comprises an ion beam (e.g. gallium ions, etc.). For example, the deposition material in the first aspect and/or the surface material in the second aspect can be produced via ion beam-induced deposition (known, for example, as (F)IBID—(focused) ion beam-induced deposition).

Further, use of multiple particle beams as particle beam is also conceivable.

In one example, in the method in the first and/or second aspect, an added gas (as additive gas) is also provided. For example, the second gas may comprise the added gas (or molecules thereof). The added gas may comprise an oxidizing agent, a halide and/or a gas having a reducing effect (i.e. reducing agent). The oxidizing agent may include, for example, an oxygen-containing gas. For example, the oxidizing agent may comprise at least one of the following: oxygen ($O_2$), ozone ($O_3$), water ($H_2O$), hydrogen peroxide ($H_2O_2$), dinitrogen monoxide ($N_2O$), nitrogen monoxide (NO), nitrogen dioxide ($NO_2$), nitric acid ($HNO_3$). The halide may include a halogen-containing gas. For example, the halide may comprise at least one of the following: $Cl_2$, HCl, $XeF_2$, HF, $I_2$, HI, $Br_2$, HBr, NOCl, $PCl_3$, $PCl_5$, $PF_3$. The gas having a reducing effect may comprise a hydrogen-containing gas. For example, the gas having reducing action may comprise at least one of the following: $H_2$, $NH_3$, $H_2N$—$NH_2$, $CH_4$.

In a preferred example, the method in the first and/or second aspect comprises the providing of a first gas including chromium hexacarbonyl, and the providing of a second gas including inversion molecules (as described herein) as second molecules and including nitrogen dioxide as oxidizing agent. In a further preferred example, the method in the first and/or second aspect comprises the providing of a first gas including chromium hexacarbonyl, and the providing of a second gas including inversion molecules (as described herein) as second molecules and including oxygen and/or water as oxidizing agent. In a further preferred example, the method in the first and/or second aspect comprises the providing of a first gas including chromium hexacarbonyl, and the providing of a second gas including inversion molecules (as described herein) as second molecules and including $H_2$ as reducing agent.

A third aspect of the invention relates to an apparatus for processing an object for lithography, comprising: means of providing a first gas; means of providing a second gas, the second gas including second molecules capable of performing an inversion oscillation; means of providing a particle beam. The apparatus is also configured to perform a method according to the examples of the first and/or second aspect of the invention that have been given herein. Further, the apparatus may comprise a computer system.

In some examples, the apparatus does not necessarily comprise means of providing a first gas, for example when it is intended merely for a passivation described herein.

A fourth aspect of the invention relates to an object for lithography, wherein the object has been processed by a method of the first and/or second aspect.

The fifth aspect of the invention relates to a method of lithographic processing of a semiconductor-based wafer. The method in the fifth aspect further comprises a lithographic transferring of a pattern associated with an object for lithography to the wafer, wherein the object has been processed according to one of the examples of the first and/or second aspect of the invention that have been given herein. The lithographic transferring may comprise a lithography method for which the object is designed (e.g. EUV lithography, DUV lithography, i-line lithography, etc.). For example, the method of the fifth aspect may comprise providing a beam source of electromagnetic radiation (e.g. EUV radiation, DUV radiation, i-line radiation, etc.). This may additionally include providing a developable resist layer on the wafer. The lithographic transferring may also be based at least partly on the radiation source and the providing of the developable resist layer. It is possible here, for example, by use of the radiation from the radiation source, to image the pattern onto the resist layer (in a transformed form).

The methods described herein may, for example, be recorded in written form. This can be achieved, for example, by use of a digital file, analogously (for example in paper form), in a user handbook, in a formula (recorded, for example, in a device and/or a computer at a semiconductor factory). It is also conceivable that a written protocol is compiled on execution of one of the methods described herein. The protocol may enable, for example, proof of the execution of the method and details thereof (for example the formula) at a later juncture (for example in the course of a fault assessment, an audit, etc.). The protocol may comprise, for example, a protocol file (i.e. log file) which can be recorded, for example, in a device and/or computer.

A sixth aspect of the invention relates to a computer program comprising instructions which, when executed by a computer system, cause the computer system to execute a method according to one of the examples of the first, second and/or fourth aspect of the invention.

A further aspect relates to the aforementioned apparatus with a memory which comprises the computer program. Further, the apparatus may have a means for executing the computer program. Alternatively, it is possible for the computer program to be stored elsewhere (e.g., in a cloud) and for the apparatus to merely have means for receiving instructions that arise from executing the program elsewhere. Either way, this may allow the method to run in automated or autonomous fashion within the apparatus. Consequently, it is also possible to minimize the intervention, for example by an operator, and so it is possible to minimize both the costs and the complexity when processing masks.

The features (and also examples) of the methods that are specified herein may also be applied or applicable correspondingly to the apparatus mentioned. The features (and also examples) of the apparatus that are specified herein may likewise also be applied or applicable correspondingly to the methods described herein.

BRIEF DESCRIPTION OF DRAWINGS

The following detailed description describes technical background information and working examples of the invention with reference to the figures, which show the following:

FIG. 4B shows, in a diagram, results of Auger electron spectroscopy on the five test structures from FIG. 4A.

DETAILED DESCRIPTION

Figure 1:
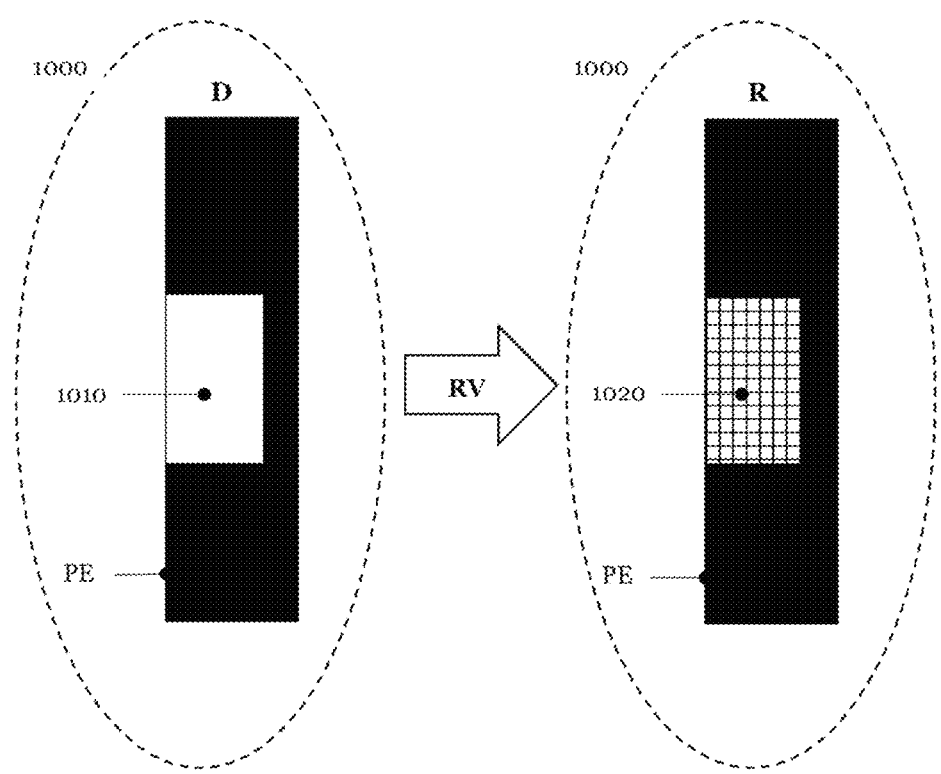
FIG. 1 gives a schematic illustration in a top view of an illustrative repair situation for an object for lithography from the prior art.

FIG. 1 gives a schematic illustration in a top view of an illustrative repair situation for an object for lithography. The object for lithography may comprise a lithographic mask suitable for any lithography method (e.g. EUV lithography, DUV lithography, i-line lithography, nanoimprint lithography etc.). In one example, the lithography mask may comprise an EUV mask, a DUV mask, an i-line lithography mask and/or a nanoimprinting stamp. Further, the object for lithography may comprise a binary mask (e.g. a chromium mask, an OMOG (opaque MoSi on glass) mask), a phase mask (e.g. a chromium-free phase mask), an alternating phase mask (e.g. a rim phase mask), a half-tone phase mask, a tritone phase mask and/or a reticle (for example with pellicle). The lithography mask may be used, for example, in a lithography method for the production of semiconductor chips.

The object for lithography may comprise (unwanted) defects. For example, a defect may be caused in the production of the object. Further, a defect may also be caused by (lithography) processing of the object, a process deviance in the (lithography) processing, transport of the object, etc. On account of the usually costly and complex production of an object for lithography, the defects are therefore usually repaired.

In the working examples described herein, for illustrative purposes, an EUV mask is frequently employed as an example of an object for lithography. However, rather than the EUV mask, any object for lithography is conceivable (for example as described herein).

FIG. 1 can show, in schematic form, in a top view, two local states D, R of a detail 1000 of an EUV mask in the course of a repair of a defect in the mask. The detail 1000 shows part of a pattern element PE of the EUV mask. The pattern element PE may also be regarded as a pattern element of the EUV mask. The pattern element PE may be part of a designed pattern which can be transferred to a wafer, for example, via a lithography method. The local state D shows a clear defect 110 in the pattern element PE. The clear defect 1010 (as described herein) may be characterized, for example, by a lack of opaque material of the pattern element PE. In relation to FIG. 1 (state D), a defect-free pattern element PE in the detail 1000 would have to have a rectangular shape, but it is clear that this target state does not exist as a result of the defect 1010. A repair procedure RV therefore typically produces repair material 1020 in the region of the clear defect 1010, such that a repaired state R of the pattern element PE can be established. For example, it is apparent in FIG. 1, in the state R, that the target state of the rectangular shape of the pattern element has been reestablished. The repair material 1020 may comprise material that has the effect that the site of the (original) defect 1010 has an opaque effect corresponding to the opaque effect of the pattern element. The opaque effect of the pattern element is especially caused by at least one absorber material of the pattern element. The repair material 1020 therefore usually comprises an absorber material which may, for example, be essentially identical to the absorber material of the pattern element, or have a similar absorbing property (for example a similar material) to the absorber material of the pattern element. A technical challenge here is that the locally produced repair material, however, may be subject to the same influences as the material of the pattern element intrinsically present on the EUV mask. The locally bounded repair material may accordingly be chemically and physically highly stressed.

During use in lithography apparatuses or lithography methods, a lithography mask may be subject to extreme physical and chemical environmental conditions, which can, for example, change material properties of a mask. This is especially true of the exposure of EUV masks, during an UV lithography method, wherein the absorbent material in particular may be highly exposed to these influences. EUV with high-energy EUV radiation typically takes place in a hydrogen atmosphere. Further, DUV masks in particular, in a DUV lithography method, may potentially be subject to material-changing environmental conditions.

High demands may therefore be made on the repair material, which may comprise absorber material, for example, with regard to stability with respect to these lithographic environmental conditions. Typically, electron beam-induced deposition is used in the repair of defects of missing material (for example in UV, DUV, EUV masks, etc.). This can produce an absorbing (e.g. chromium-containing) deposit. Frequently, a chromium precursor gas is used in conjunction with an oxidizing additive gas (e.g. $NO_2$, $O_2$, $H_2O$, etc.). The main aim of adding the additive oxidizing gases is to reduce the carbon content in the deposit, since remaining carbon can additionally lower the stability of the deposit. However, the resultant chromium oxide-containing material (i.e. repair material) can often only partly satisfy the demands of stability with respect to the aggressive ambient conditions that prevail in lithography processes (for example in UV, DUV, EUV lithography methods). Damage to the repair material (and to the mask) therefore cannot always be ruled out.

The damage to the repair material (and to the mask) may comprise chemical and/or physical changes in the material, which may also have various causes. Firstly, the causes may lie in the operations during the lithography method (for example in exposure operations). For example, this may be caused by the radiation in an exposure (e.g. EUV radiation, DUV radiation, etc.), a (process) temperature, a reaction with hydrogen and/or other reactive hydrogen species (e.g. free radicals, ions, plasma) and/or a reaction of the mask with purge gases (e.g. $N_2$, extreme clean dry air (XCDA®), noble gases) in conjunction with radiation in the exposure. Secondly, the causes may lie in downstream processes (for example in processing of the masks after a lithography method). This may comprise, for example, a mask cleaning. It is possible here for the repair material previously damaged by chemical and/or physical processes during the lithography method (and the mask) to be additionally damaged by the downstream processes.

Figure 2:
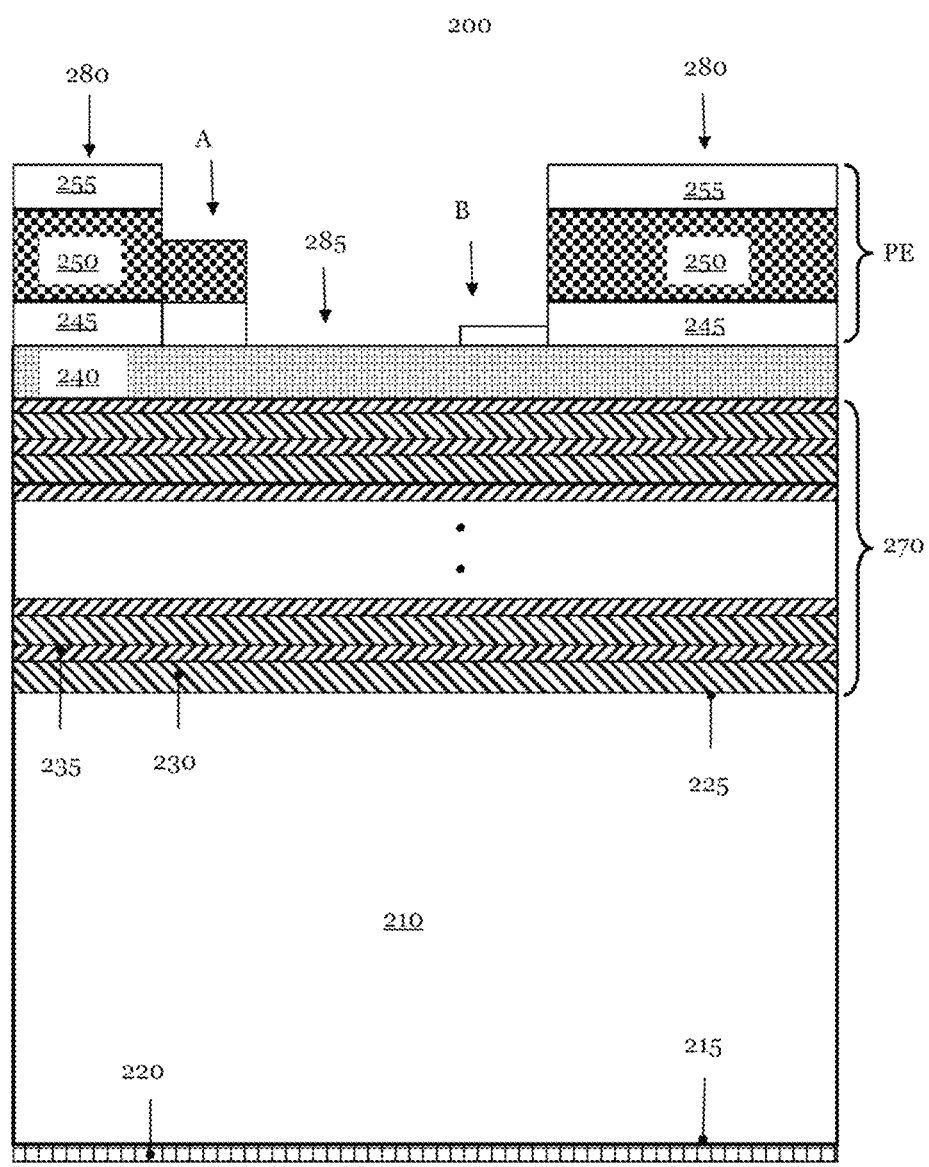
FIG. 2 gives a schematic illustration in a cross section, by way of example, of processes in a repair of a defect in an object for lithography.

FIG. 2 gives a schematic illustration in a cross section, by way of example, of processes in repair of a defect in an object for lithography. Further, FIG. 2 presents, in schematic form, a section through a reflective lithography mask 200 for the EUV wavelength range (i.e. an EUV mask or EUV photomask). The illustrative EUV mask 200 may be designed for an exposure wavelength in the region of 13.5 nm. The EUV mask 200 may include a substrate 210 made of a material with a low coefficient of thermal expansion, for example quartz. Other dielectrics, glass materials or semiconducting materials likewise can be used as substrates for EUV masks, such as ZERODUR®, ULE® or CLEARCERAM®, for instance. The reverse side 215 or the reverse-side surface 215 of the substrate 210 of the EUV mask 200 may serve to hold the substrate 210 during the production of the EUV mask 200 and during the operation thereof in an EUV photolithography apparatus. Preferably, a thin electrically conductive layer 220 for holding the substrate 210 on an electrostatic chuck (ESC) is applied to the reverse side 215 of the substrate 210.

The front face 225 of the substrate 210 may comprise a deposited multilayer film or a deposited multilayer structure 270 having, for example, 20 to 80 pairs of alternating molybdenum (Mo) 230 and silicon (Si) layers 235, which are also referred to as MoSi layers. Instead of molybdenum, it is also possible to use layers composed of other elements having a high mass number, such as e.g. cobalt (Co), nickel (Ni), tungsten (W), rhenium (Re), zirconium (Zn) or iridium (Ir), for the MoSi layers. In order to protect the multilayer structure 270, a capping layer 240 of silicon dioxide, for example, may be applied on the uppermost silicon layer 235.

Other materials such as ruthenium (Ru), for example, are likewise conceivable as capping layer 240.

It is possible for structured pattern elements PE to be present on the capping layer 240. A pattern element PE may comprise several layers. For example, a pattern element PE may comprise a buffer layer 245 atop the capping layer 240. Further, a pattern element PE may comprise an absorption layer 250 atop the buffer layer 245. Further, a pattern element PE may comprise an antireflection layer 255 atop the absorption layer 250. A pattern element PE may be designed such that it is opaque (i.e. not transparent to light or highly light-absorbing) with respect to light radiation which is used, for example, in EUV lithography (for example light radiation having a wavelength of 13.5 nm). It is possible here for all layers of the pattern element PE to be designed to be opaque with respect to this light radiation. In particular, the absorption layer 250 may have the main proportion of the absorption of the (EUV) light radiation, and the buffer layer 245 and/or the antireflection layer 255 may also contribute to absorption. By virtue of the pattern elements PE provided, the EUV mask 200 accordingly has absorbing regions 280 and reflecting regions 285.

Possible materials for the buffer layer 245 may include quartz ($SiO_2$), silicon-oxygen nitride (SiON), Ru, chromium (Cr), chromium oxide and/or chromium nitride (CrN). In particular, chromium nitride may be preferred as material for the buffer layer 245 in an EUV mask. Possible materials for the absorption layer 250 may include chromium nitride, chromium, chromium oxide, titanium nitride (TiN) and/or tantalum nitride (TaN). In particular, chromium nitride may be preferred as material for the absorption layer 250 in an EUV mask. The antireflection layer may comprise, for example, tantalum oxynitride (TaON) and/or chromium nitride.

In the course of the repair, it may be necessary to replace missing material of the pattern element PE. It may be necessary here to produce any material of a layer of the pattern element PE. For example, a repair operation RV may comprise the producing of the material of the absorption layer 250, which is shown schematically by A in FIG. 2. For example, a repair of an only partly missing absorption layer 250 may be necessary. The repair material may be produced here directly on the (partly existing) absorption layer 250. In this case, the boundary layer of the repair material produced is defined with regard to the absorption layer 250 (and not, for example, with regard to the buffer layer 245 or a substrate). Further, a repair operation RV may comprise the producing of the material of the buffer layer 245, which is shown schematically by B in FIG. 2. It is also conceivable here that a repair operation RV produces material for the antireflection layer 255 and/or material for the capping layer 240. Further, a combination of the producing of various materials of various layers of the pattern element PE is also conceivable (for example, a repair operation RV may produce the material of the buffer layer 245 and also of the absorption layer 250). Further, it is also possible that only an absorber material corresponding, for example, to the material of the absorption layer 250 or having similar opaque properties thereto is produced in a repair operation RV. Correction of the missing sections of the buffer material 245 and/or of the antireflection layer 255 need not necessarily be required for the correction of the (clear) defect.

Figure 3:
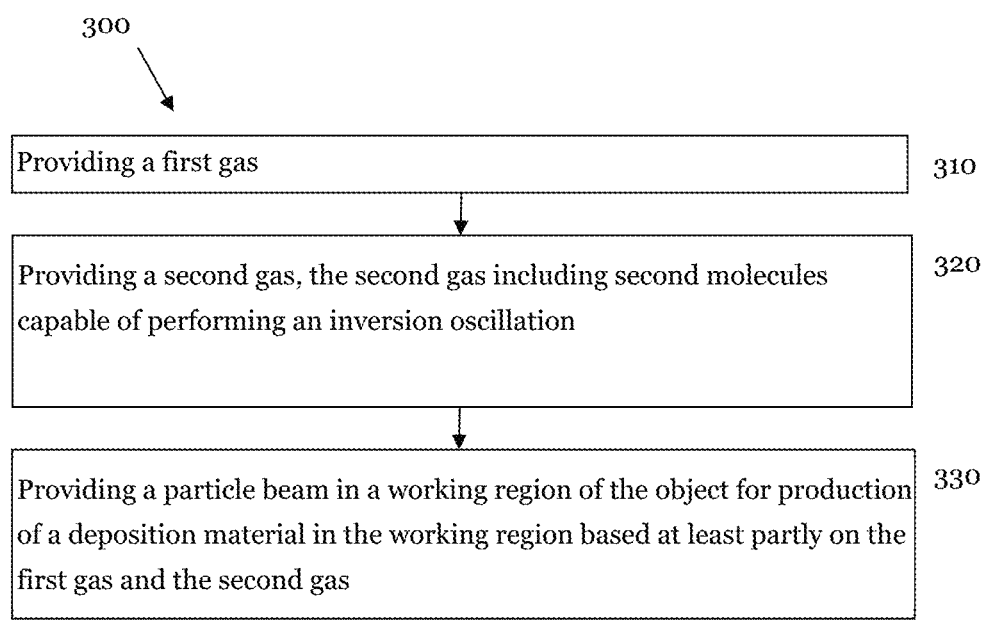
FIG. 3 shows a schematic diagram of an illustrative method of the invention.

FIG. 3 shows a schematic diagram of an illustrative method 300. The method 300 may be employed in order to produce missing material of a pattern element PE. As described herein, this can be utilized, for example, for the remedying of a clear defect.

The method may comprise providing 310 of a first gas. The first gas may include, for example, a chromium-containing gas, preferably chromium hexacarbonyl.

Further, the method 300 may comprise providing 320 of a second gas, the second gas including second molecules capable of performing an inversion oscillation. The second gas may include ammonia, for example, since ammonia is capable of performing an inversion oscillation. In particular, the second gas may be provided with a gas flow rate of less than 5 sccm, preferably less than 2 sccm, more preferably less than 0.5 sccm.

The method 300 further comprises providing 330 a particle beam in a working region for production of a deposition material based at least partly on the first gas and the second gas. In particular, the producing may comprise electron beam-induced deposition, which takes place in a gas atmosphere including, for example, chromium hexacarbonyl (as first gas) and ammonia (as second gas). The method may further comprise producing within a particular parameter space. For example, the parameter space may comprise producing of the second gas with a gas flow rate as described herein. Further, further parameter spaces for the method are conceivable, which may relate, for example, to the first gas, the second gas and/or the particle beam or parameters thereof. Some parameter spaces of the illustrative method 300 enabled particularly advantageous properties of the deposition material produced. Especially when a nitrogen-containing second gas is used, the parameter spaces specified may be advantageous in order to achieve a high nitride content of the deposited material (compared to deposition with solely the first gas). The carbon content in the deposited material may be reduced (compared to deposition with solely the first gas).

Figure 4A:
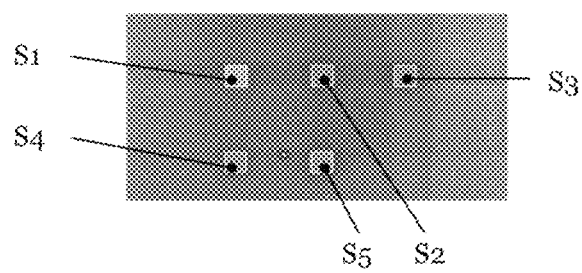
FIGS. 4A-4B FIG. 4A shows a scanning electron micrograph of five test structures, with some of the test structures having been produced by the method according to the invention.

FIG. 4A shows, in a top view, a scanning electron micrograph of five test structures, with some of the test structures having been produced by the method according to the invention. The five test structures S1, S2, S3, S4, S5 here are cuboidal structures, with test structures S2, S3, S4, S5 having been produced with different parameter spaces of the method according to the invention. What is common to all test structures S1-S5 is that chromium hexacarbonyl has been provided as first gas, and the producing of the deposition material was based on electron beam-induced deposition. What the test structures S2-S5 have in common is that the method according to the invention was effected with provision of ammonia as the second gas. The test structure S1 was produced as reference structure, and the test structure S1 was produced without the inventive provision of the second gas (e.g. ammonia) (i.e. only the first gas was present). The process parameters are set out in detail hereinafter.

The test structure S1 was produced merely with provision of chromium hexacarbonyl and electron beam-induced deposition. A relatively short dwell time of the electron beam of 0.5 µs was chosen. The test structure S2 was produced with a gas flow rate of the second gas (ammonia in this example) of 0.1 sccm and the same dwell time of the electron beam. The test structure S3 was produced with a gas flow rate of the second gas of 0.25 sccm and again the same dwell time of the electron beam. The test structure S4 was produced with a gas flow rate of the second gas of 0.25 sccm and a relatively long dwell time of the electron beam (10 times longer than in the case of S1). The test structure S5 was produced with a gas flow rate of the second gas of 0.4 sccm and a dwell time of the electron beam as in the case of S1.

For the test structures S2 to S5, the scanning of the electron beam in the particle beam-induced deposition was chosen such that the height dimensions of the test structures S2 to S5 are in the same order of magnitude (about 50 nm). The height dimension of the test structure S1 was in an order of magnitude of about 130 nm, which could be attributable to the lack of provision of the second gas in the production of the reference structure S1. Further, in the processing of the test structures S1, S2, S3, S4, S5, a pixel pattern was scanned, which geometrically defines the test structure. The electron beam was directed at least once onto all pixels of the pixel pattern of each test structure. The scanning may be regarded as the producing of a partial layer, with definition of the height of the test structure via repeated scanning. Scanning may be referred to as a loop or cycle. The test structures S1, S2, S3 and S5 were each produced with similar numbers of loops. The number of loops for the test structure S4 was distinctly smaller on account of the high dwell time.

Figure 4B:
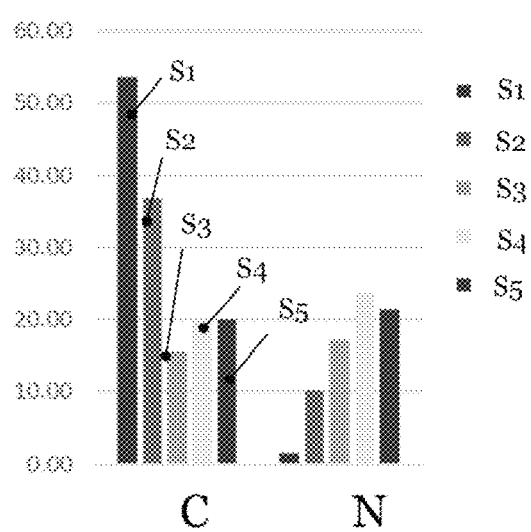

FIG. 4B shows, in a diagram, results of Auger electron spectroscopy on the five test structures from FIG. 4A. The results of the Auger electron spectroscopy (or Auger spectroscopy) can therefore enable a relative comparison of the test results. The ordinate of FIG. 4B indicates a molar proportion in atomic percent. The abscissa of FIG. 4B indicates the substance evaluated in the Auger spectroscopy, showing the results for all test structures S1, S2, S3, S4, S5 as a group for each substance. The analyzed substances shown in FIG. 4B are carbon C and nitrogen N. Oxygen and chromium were likewise analyzed, but are not shown in FIG. 4B. As apparent in FIG. 4B, a distinctly elevated nitrogen content by comparison with the reference structure S1 is apparent when the method according to the invention is used (i.e. for test structures S2 to S5). The method according to the invention can enable a nitrogen content of at least 10 atomic percent, with no significant nitrogen content being detectable in the deposition material in the reference structure S1 by the conventional method. This suggests preferential production of chromium nitride by the method according to the invention with use of ammonia by comparison with the conventional method. For structures S4 and S5, it was even possible to achieve a nitrogen content of >20 atomic percent. For the illustrative method according to the invention (with chromium hexacarbonyl and ammonia), a fundamental chemical reaction of a $Cr(CO)6+b\ NH_3 \rightarrow c\ Cr_xO_yN_z+d\ CO+e\ H_2O+f\ CH_4+g\ CO_2+h\ N_2$ is assumed (for the subsequent passivating, by contrast, the equation would be $Cr_xO_yC_z+d\ NH_3 \rightarrow Cr_xO_{y-a}C_{z-b}N_c+e\ H_2O+f\ CO_2$). The exact reaction can be influenced by the parameter space of the method.

Further, significant minimization of the carbon content when the method according to the invention is used (i.e. for test structures S2 to S5) is apparent compared to the reference structure S1. It is possible here to show that, by the method according to the invention, the carbon content may be below 40 atomic percent, preferably below 30 atomic percent, more preferably below 20 atomic percent. The method according to the invention accordingly brought about a specific reduction in the carbon content by 25 percent, preferably by 40 percent, more preferably by 60 percent (compared to deposition without provision of the second gas). An explanation for this may be that ammonia as inversion molecule results in an advantageous effect that can be enhanced by a suitable parameter space. In the case of electron beam-induced deposition of chromium with chromium hexacarbonyl, CO molecules may remain on the surface. A high supply of NH3 in the gas phase, which can be ensured, for example, even by virtue of its property as an inversion molecule, can increase the probability of displacement of CO by NH3 from the surface. This can have the effect that less carbon is deposited in the deposited material. These two effects (i.e. preferential production of chromium nitride or an elevated nitrogen content and reduction in the carbon content in the deposited material) can enable an optimized repair material in the mask repair, which can better withstand the influences specified herein. Moreover, there is a clear trend that the nitrogen content increases with increasing gas flow rate of the second gas. Since the nitrogen content is reduced to a comparatively minor degree in the case of a relatively high gas flow rate of ammonia (0.4 sccm) in the case of test structure S5, it is possible to conclude that an advantageous gas flow rate of the second gas is 0.25 sccm.

As mentioned herein, the chromium content analyzed is not shown in FIG. 4B. The chromium content of the test structures S1, S2, S3, S4, S5 did not show any significant differences or fluctuations and was measured in the range of about 15-25 at %. There is thus a pointer that the method according to the invention does not significantly influence the chromium content. It should be noted that, by use of the method according to the invention, a higher chromium content was also detectable (for example a chromium content of at least 25 at %, at least 30 at %, at least 35 at %). It is also conceivable that the chromium content of the deposition material is also at least 50 at %, at least 70 at % or at least 80 at % (or else between 35 at % and 99 at %). It is additionally also conceivable that the chromium content may be below 15 at %. Further, an elevated oxygen content was also detected in test structures S2, S3, S4, S5 compared to the reference structure S1 (without provision of the second gas). The oxygen content was increased, for example, at least by a factor of 1.5 or at least by a factor of 2.

Further, there is an indication that a relatively long dwell time of the electron beam (in the case of test structure S4) can produce an elevated nitrogen content in the deposition material, compared to a shorter dwell time of the electron beam (in the case of test structures S2, S3, S5).

With regard to the results from FIGS. 4A and 4B, it is accordingly possible by use of the method according to the invention to achieve, or aim for, a nitrogen content in the material produced of at least 5 at %, preferably at least 10 at %, more preferably at least 20 at %. The nitrogen content of the material produced may also be at least doubled, tripled, quadrupled and/or increased by a factor of ten by use of the method according to the invention compared to production by a method from the prior art (for example without provision of the second gas).

The reduced dipole character of the ammonia can lower the probability of absorption of the ammonia on the substrate surface compared to nitrogen dioxide. As a consequence, the concentration of ammonia molecules in the gas phase above the substrate surface may be increased. This can increase the probability that the desired nitrogen-containing deposition material is already formed in the gas phase. This can possibly be explained in that exchange of CO ligands on the chromium atom for $NH_3$ ligands already takes place in the gas phase. One reaction that can take place here is as follows: $Cr(CO)_6 + n\ NH_3 \rightarrow Cr(CO)_{6-n}(NH_3)_n + n\ CO$, with n=1 to 6.

For an additional analysis, two further test structures E1 and E2 were produced, with production of test structure E2 with a parameter space of the method according to the invention. The test structures E1, E2 were produced with a length and width of 20 μm×20 μm and with a height of 10 nm to 20 nm. The test structures were analyzed by x-ray photoelectron spectroscopy (abbreviation: XPS). This analyzed carbon C, oxygen O, chromium in an oxide compound Cr-Ox, metallic chromium Cr-Met, nitrogen N, total chromium content Cr-sum. The test structure E1 was produced as reference structure by a known method comprising the providing of chromium hexacarbonyl as the first gas and providing nitrogen dioxide as the second gas, nitrogen dioxide being incapable of performing an inversion oscillation (at the process temperature of the electron beam-induced deposition). The test structure E1 was produced with a gas flow rate of the second gas (i.e. of nitrogen dioxide) of 0.5 sccm and a dwell time of the electron beam of 5 μs. The test structure E2 was produced with chromium hexacarbonyl as the first gas and ammonia as the second gas via electron beam-induced deposition. The parameter space in the process for production of test structure E2 was as follows: a gas flow rate of the second gas (i.e. ammonia) of 0.25 sccm, a process temperature of 17° C., a dwell time of the electron beam of 5 μs, a frame refresh rate of 2500 μs. Further, the process for production of the test structure E2 was effected at an acceleration voltage of the electron beam of between 0.3 kV and 1 kV, for example in the region of 0.6 kV (kV: kilovolts) and a current of the electron beam of between 1 pA and 100 pA, for example in the region of 28 pA (pA: picoampere). The pixel pattern was scanned in such a way that the height of the test structure was in the range from 10 nm to 20 nm. A scanning pattern was chosen in which every tenth row was addressed sequentially in order to minimize depletion of the process gas. In some examples, for the production of the test structure E2, the gas flow rate of the second gas (e.g. ammonia) may be between 0.1 sccm and 2 sccm, between 0.1 sccm and 1 sccm, and/or between 0.1 sccm and 0.5 sccm. The process temperature may comprise the (preset) temperature of the first gas and the (preset) temperature of the second gas. In some examples, for the production of the test structure E2, the dwell time of the electron beam may encompass a range between 0.1 μs and 10 μs, between 0.3 us and 7 us and/or between 1 us and 6 μs. In some examples, the frame refresh rate may lie between 0.5 ms and 5 ms, between 0.7 ms and 4 ms and/or between 1 ms and 3 ms. Further, it is also conceivable that the process temperature (of the first and/or second gas) is in the range from 0° C. to 60° C., or else between 10° C. and 40° C., between 12° C. and 30° C. and/or between 12° C. and 20° C.

In the additional analysis, it was found that the test structure E2 includes about 23 atomic percent (at %) of nitrogen. It has thus been shown that it is possible to achieve an elevated nitrogen content in test structure E2 via a parameter space of the method according to the invention. This also suggests that the method according to the invention enables the production of a high chromium nitride content in the deposition material. This effect may especially be advantageous in the context of a repair operation RV, since chromium nitride can be a resistant material to aggressive chemical/physical environmental conditions.

Further, the oxygen content in the test structure E2 was significantly lower than in the reference structure E1. The reduction in the oxygen content corresponded roughly to the nitrogen content encountered in test structure E2. It can thus be concluded that the reduction in the oxygen content can roughly correspondingly increase the nitrogen content.

The carbon content was minimally elevated in test structure E2 compared to reference structure E1, and was at a low level in both test structures (in the single-digit percent range). It has been found here that the carbon content (oxygen content) of reference structure E1 had a lower (higher) level than reference structure S1 from FIG. 4B. It should be mentioned in this regard that the reference structure E1 was produced via a deposition method with nitrogen dioxide as additive gas (and chromium hexacarbonyl as the first gas), and the reference structure S1 from FIG. 4B was produced via a deposition method without an additive gas (and therefore exclusively with chromium hexacarbonyl as deposition gas). It was thus shown that, when an inversion molecule was used (ammonia in this case) rather than nitrogen dioxide as additive gas, no significant change in the carbon content is caused (and the carbon content can still remain low by the method according to the invention). Further, it was possible to increase the content of metallic chromium in test structure E2 sevenfold by comparison with E1. The proportion of chromium in an oxide compound was somewhat lower in test structure E2 than in test structure E1.

A reduction in the chromium oxide content may be advantageous with regard to an EUV lithography method. Possible chemical reactions that can take place between chromium oxide (e.g. $Cr_2O_3$) and hydrogen in an EUV lithography apparatus include, for example, the partial reduction of chromium ($Cr_2O_3+3H_2 \rightarrow 2Cr+3H_2O$) and a local change in the oxidation state of chromium atoms. For example, the oxidation state can change from Cr(III) to Cr(II), Cr(I) and/or Cr(0). It is likewise conceivable that the oxidation state can change from Cr(IV) to Cr(III), Cr(II), Cr(I) and/or Cr(0). The local partial change in the oxidation state of the chromium atoms can increase the heterogeneity of the material, such that the chemical and physical durability thereof is reduced. It is also conceivable that, for example, reactive hydrogen species in an EUV lithography apparatus remove oxygen from the chromium oxide-containing material, which can give rise to defects in the solid material. These defects can accelerate erosion of the material in subsequent cleaning processes. The reduction in the chromium oxide content via the method according to the invention can therefore minimize the effects mentioned. It is also conceivable that the elevated chromium nitride content that can be produced via the method according to the invention additionally minimizes the effects mentioned that are associated with a particular chromium oxide content.

In summary, the repair material produced by the method according to the invention may be more stable or resistant in a repair of an EUV mask with respect to the influences to which the EUV mask may be subjected in the course of processing (for example as mentioned herein).

The test results of the chromium nitride-containing deposition metal produced suggest an increase in durability, resistance and stability of the material with respect to outside chemical/physical influences compared to conventionally produced material. In the case of repair of the EUV mask via the method 300 (or a method according to the first and/or second aspect), this may especially be advantageous in the case of use of the repaired EUV mask for a lithography method. For example, this may enable an increase in the number of DUV and/or EUV exposure cycles (of the lithography method) that a repaired lithography mask can undergo before the optical properties of the repaired site have changed to such a degree that it no longer satisfies the required specifications with regard to the critical dimension CD. Further, this can lead to a reduction in damage by downstream processes, for example a mask cleaning operation. In particular, stability may exist with respect to cleaning processes comprising at least one of the following steps: removal of contamination, removal of carbon-containing contamination, removal of particles, use of oxidizing agents, use of acids, use of oxidizing acids, use of acids with oxidizing agents, use of a cleaning solution with pH<7, use of $H_2SO_4$ (for example with $H_2O_2$), use of UV light, use of light that can react with cleaning chemicals and activates them, use of a plasma, use of an oxygen plasma, use of a basic solution, use of a solution with pH<7, use of an $NH_3$-containing solution. Further, the method according to the invention (in the first and/or second aspect) can enable a reduction in erosion or degradation of the deposit (at the repaired site). The degradation may especially comprise at least one of the following: global progressive erosion, (gradual) leafing, local erosion, simultaneous loss of large areas of the deposit, loss of desired optical properties.

Further, the working examples that follow are possible for the method according to the invention in the first and/or second aspect. For example, it is conceivable that the second gas comprises at least one of the following: a reducing additive precursor; an additive precursor comprising hydrogen; an additive precursor comprising at least one nitrogen atom and at least one hydrogen atom. In a further example, it is conceivable that the deposition material produced in accordance with the invention, and also the (passivated) surface material, can be compacted or stabilized by electron beam bombardment (for example in a separate processing operation).

In some examples, an acceleration voltage of the electron beam of 0.1 to 2 kV, or 0.2 to 1.5 kV or 0.3 to 1 kV, may be used. It is possible in each case to use an electron beam current of 28 pA. Alternatively, currents within other ranges are conceivable, for example 1 to 100 pA, 5 to 80 pA or 10 to 60 pA.

Figure 5:
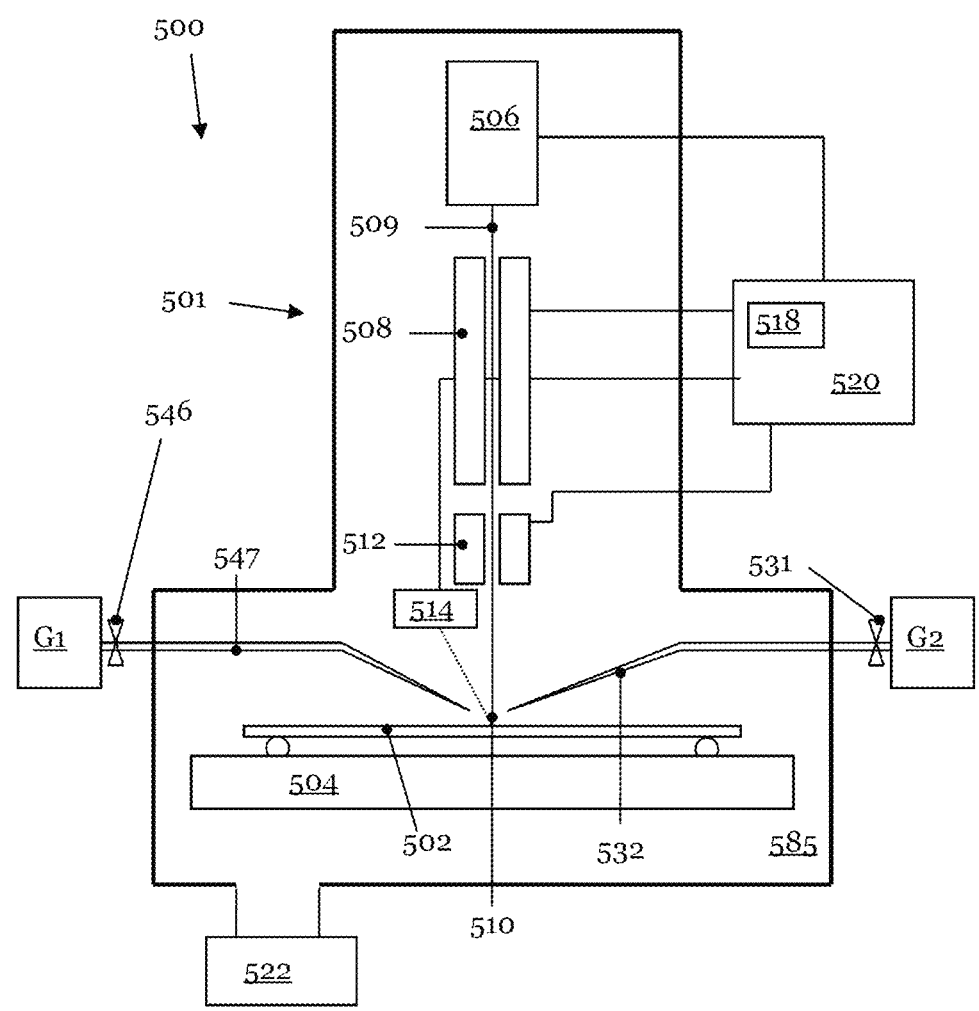
FIG. 5 shows a schematic section of an illustrative apparatus according to the invention.

FIG. 5 shows a schematic section of an illustrative apparatus 500 according to the invention. The apparatus 500 may be configured such that it can perform the method 300 or a method in the first and/or second aspect of the invention. In one example, the apparatus 500 of FIG. 5 comprises a mask repair apparatus for repair or processing of lithography masks. The apparatus 500 may be used to localize and to repair or remedy mask defects. The apparatus 500 may comprise parts such as the apparatus described in US 2020/103751 A1 (see the corresponding FIG. 3A therein).

The illustrative apparatus 500 of FIG. 5 may comprise, for example, a scanning electron microscope (SEM) 501 for provision of a particle beam, which, in this example, is an electron beam 509. An electron gun 506 can generate the electron beam 509, which can be directed by the beam-forming elements 508 and 512 as a focused electron beam 510 onto a lithography mask 502, which is arranged on a sample stage 504 (or chuck). Further, the scanning electron microscope 501 can be used to control parameters/properties of the electron beam 509 (e.g. acceleration voltage, dwell time, current, focusing, spot size, etc.). The parameters of the electron beam 509 may be adjusted, for example, in relation to a parameter space of the methods described herein. The electron beam 509 may serve as an energy source for initiating a local chemical reaction in a working region of the lithography mask 502. This may be utilized, for example, for the methods described herein (for example for the implementation of the electron beam-induced deposition in the first aspect, the electron beam-assisted passivation in the second aspect). In addition, the electron beam 509 may be utilized for imaging of the lithography mask 502. The apparatus 500 may comprise a detector 514 for detecting electrons.

In order to conduct the corresponding methods specified herein, the illustrative apparatus 500 of FIG. 5 may include at least two reservoir vessels for at least two different processing gases or precursor gases. The first reservoir vessel G1 can store the first gas. The second reservoir vessel G2 can store the second gas, including molecules capable of performing an inversion oscillation. The second gas may also be regarded as an additive gas. Further, in the illustrative apparatus 500, each reservoir vessel G1, G2 has its own gas inlet system 547, 532, which can end with a nozzle close to the point of incidence of the electron beam 510 on the lithography mask 502. It is possible for each reservoir vessel G1, G2 to have its own control valve 546, 531 in order to control the amount of the corresponding gas provided per unit time, i.e. the gas flow rate of the corresponding gas. This can be effected in such a way that the gas flow rate is controlled at the point of incidence of the electron beam 510. Further, the apparatus 500, in one example, may include further reservoir vessels for additional gases that can be added to the process in the first and/or second aspect as one or more (additive) gases (e.g. oxidizing agent, reducing agent, halides as described herein). The apparatus 500 in FIG. 5 may include a pump system 522 for generating and maintaining a pressure required in the process chamber 585.

The apparatus 500 may also comprise a control unit 518 which may, for example, be part of a computer system 520. The apparatus 500, in one example, may be configured such that the computer system 520 and/or the control unit 518 controls the process parameters of the methods disclosed herein. This configuration can enable controlled or automated implementation of the methods according to the invention specified herein, for example without manual interventions. This configuration of the apparatus 500 can be achieved or enabled, for example, via the computer program according to the invention as described herein.

As described herein (in the summary of the invention), the invention may also relate to a method of processing a surface material of an object for lithography, comprising: providing a second gas, the second gas including second molecules capable of performing an inversion oscillation; and providing a particle beam in a working region of the object for passivation of the surface material within the working region based at least partly on the second gas. For example, ammonia and/or $H_2N-NH_2$ may be provided as the second gas within the working region comprising the surface material. By further providing the particle beam (e.g., an electron beam) in said working region, a particle beam induced reaction can be initiated which may cause a passivation of the surface material (as described herein).

The surface material to be passivated may comprise any material included on the object for lithography. For example, the surface material may comprise an absorbing material (e.g., of a light absorbing structure of the object).

The surface material to be passivated may also comprise the herein described deposition material which was deposited according to the method of the first aspect of the invention. For example, the deposition material may be deposited by providing an electron beam as a particle beam, providing a first gas and providing inversion molecules as the second gas (as described herein). For example, the second gas may be provided with a gas flow rate of less than 5 sccm, preferably less than 2 sccm, more preferably less than 0.5 sccm. Subsequently, said deposition material may be (locally) passivated by providing an electron beam and inversion molecules within a working region comprising the deposition material according to the method of the second aspect of the invention (as described herein). In other words, the first gas and the inversion molecules may be used for electron beam induced deposition of material. Only providing the inversion molecules, for example, may be used for electron beam induced passivation, wherein in some examples substantially no material may be deposited but existing material may be passivated by the inversion molecules and the electron beam.

In an example (as, for example, described in the summary), the production of the deposition material and the passivation thereof may be repeated. For example, in a first step a first deposition material may be deposited on the object according to the method of the first aspect (by providing a particle beam, a first gas and inversion molecules as a second gas, as described herein). Subsequently, the first deposition material may be passivated by providing a particle beam and inversion molecules on the first deposition material according to the method of the second aspect (as described herein). Subsequently, a second deposition material may be deposited on the surface of the passivated first deposition material. The second deposition material may be deposited according to the method of the first aspect (by providing a particle beam, a first gas and inversion molecules as a second gas, as described herein). Subsequently, the second deposition material may be passivated by providing a particle beam and inversion molecules on the second deposition material according to the method of the second aspect (as described herein).

This alternating deposition and passivation may be repeated as often as desired.

Further, at least one of the following may be included in the invention as a first gas (for example as a deposition gas): (metal, transition element, main group) alkyls such as cyclopentadienyl (Cp), methylcyclopentadienyl (MeCp), trimethylplatinum ($CpPtMe_3$ or $MeCpPtMe_3$), tetramethyltin $SnMe_4$, trimethylgallium $GaMe_3$, ferrocene $Cp_2Fe$, bisarylchromium $Ar_2Cr$ and other compounds of this kind. Further, at least one of the following may be included in the invention as first gas: (metal, transition element, main group) carbonyls such as chromium hexacarbonyl $Cr(CO)_6$, molybdenum hexacarbonyl $Mo(CO)_6$, tungsten hexacarbonyl $W(CO)_6$, dicobalt octacarbonyl $Co_2(CO)_8$, triruthenium dodecacarbonyl $Ru_3(CO)_{12}$, iron pentacarbonyl $Fe(CO)_5$ and other compounds of this kind. Further, one of the following may be included in the invention as first gas: (metal, transition element, main group) alkoxides such as tetraethoxysilane $Si(OC_2H_5)_4$, tetraisopropoxytitanium $Ti(OC_3H_7)_4$ and other compounds of this kind.

Further, at least one of the following may be included in the invention as first gas: (metal, transition element, main group) halides such as $WF_6$, $WCl_6$, $TiCl_6$, $BCl_3$, $SiCl_4$ and other compounds of this kind. Further, at least one of the following may be included in the invention as first gas: (metal, transition element, main group) complexes such as copper bis(hexafluoroacetylacetonate) $Cu(C_5F_6HO_2)_2$, dimethylgold trifluoroacetylacetonate $Me_2Au(C_5F_3H_4O_2)$ and other compounds of this kind. Further, one of the following may be included in the invention as first gas: organic compounds such as CO, $CO_2$, aliphatic or aromatic hydrocarbons, constituents of vacuum pump oils, volatile organic compounds and further such compounds.

In some implementations, the second gas can include second molecules that include nitrogen and hydrogen in a chemical compound. For example, the second molecules can include ammonia, $H_2N-NH_2$, or a combination of the above. In some implementations, the second gas can include second molecules that include nitrogen and a halogen in a chemical compound. For example, the second molecules can include $NF_3$, $NCl_3$, $NI_3$, $NBr_3$, or a combination of two or more of the above. In some implementations, the second gas can include second molecules that include nitrogen, hydrogen and a halogen in a chemical compound. For example, the second molecules can include $NH_2X$ where X includes a halogen; $NHX_2$ where X includes a halogen, or a combination of the above.

In some implementations, the control unit 518 and/or the computer system 520 can include one or more data processors configured to execute one or more computer programs that include a plurality of instructions according to the principles described above. The control unit 518 and/or the computer system 520 can include one or more data processors for processing data, one or more storage devices for storing data, such as one or more databases, and/or one or more computer programs including instructions that when executed by the control unit and/or the computer cause the control unit and/or computer to carry out the processes. The computer can include one or more input devices, such as a keyboard, a mouse, a touchpad, and/or a voice command input module, and one or more output devices, such as a display, and/or an audio speaker. In some implementations, the control unit and/or the computer can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A computer program can be written in any form of programming language, including compiled or interpreted languages, and it can be deployed in any form, including as a stand-alone program or as a module, component, subroutine, or other unit suitable for use in a computing environment.

For example, the computer can be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, solid state drives, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM, DVD-ROM, and/or Blu-ray discs.

In some implementations, the processes described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as CD-ROM, DVD-ROM, Blu-ray disc, a solid state drive, or a hard drive, readable by a general or special purpose programmable computer or delivered (encoded in a propagated signal) over a network to the computer where it is executed. The functions can be performed on a special purpose computer, or using special-purpose hardware, such as coprocessors. The software can be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system can also be considered to be implemented as a computer-readable storage medium, configured with a computer program, where the storage medium so configured causes a computer system to operate in a specific and predefined manner to perform the functions described herein.

What is claimed is:

1. A method of processing an object for lithography, comprising:
   providing a first gas;
   providing a second gas, the second gas including second molecules capable of performing an inversion oscillation;
   providing a particle beam in a working region of the object for production of a deposition material in the working region based at least partly on the first gas and the second gas;
   wherein the second gas is provided with a gas flow rate of less than 5 sccm.

2. The method of claim 1, wherein the second gas is provided with a gas flow rate of less than 0.01 sccm.

3. The method of claim 1, wherein the particle beam is provided with a dwell time of the particle beam of 0.1 µs to 10 µs, preferably 0.3 µs to 7 µs.

4. The method of claim 1, wherein the first gas and/or the second gas is provided in such a way that the deposition material at least partly forms in a gas phase without the influence of the particle beam.

5. The method of claim 1, wherein the first gas includes first molecules comprising a carbonyl compound.

6. The method of claim 5, wherein the first molecules comprise a metal carbonyl.

7. The method of claim 6, wherein the metal carbonyl comprises a chromium carbonyl.

8. The method of claim 1, wherein the deposition material comprises a chromium nitride.

9. The method of claim 8, wherein the chromium nitride comprises at least 10 atomic percent of nitrogen.

10. The method of claim 1, wherein the deposition material is produced in such a way that a defect of the object is remedied.

11. The method of claim 10, wherein the defect comprises a clear defect.

12. The method of claim 1, wherein the inversion oscillation comprises a pyramidal inversion of the second molecules.

13. The method of claim 1, wherein the second molecules comprise a trigonal-pyramidal geometry.

14. The method of claim 1, wherein the second molecules comprise nitrogen and hydrogen in a chemical compound.

15. The method of claim 1, wherein the second molecules comprise ammonia, $NH_3$.

16. The method of claim 1, wherein the second molecules comprise $H_2N$—$NH_2$.

17. The method of claim 1, wherein the second molecules comprise nitrogen and a halogen in a chemical compound.

18. The method of claim 17, wherein the second molecules comprise at least one of the following molecules: $NF_3$, $NCl_3$, $NI_3$, $NBr_3$.

19. The method of claim 1, wherein the second molecules comprise nitrogen, hydrogen and a halogen in a chemical compound.

20. The method of claim 19, wherein the second molecules comprise at least one of the following molecules: $NH_2X$ where X comprises a halogen; $NHX_2$ where X comprises a halogen.

21. The method of claim 1, wherein the second molecules have a lower probability of absorption in the working region than $NO_2$ molecules.

22. The method of claim 1, wherein the particle beam comprises an electron beam.

23. The method of claim 1 wherein the object for lithography comprises a lithography mask.

24. A method of processing a surface material of an object for lithography, comprising:
providing a second gas, the second gas including second molecules capable of performing an inversion oscillation;
providing a particle beam in a working region of the object for passivation of the surface material within the working region based at least partly on the second gas.

25. The method of claim 24, wherein the method further comprises producing the surface material in the working region, based at least partly on providing of a first gas and the particle beam before the passivation of the surface material.

26. The method of claim 24, wherein the passivating comprises producing a passivation layer on the surface material.

27. An apparatus for processing an object for lithography, comprising:
means of providing a first gas;
means of providing a second gas, the second gas including second molecules capable of performing an inversion oscillation;
means of providing a particle beam;
wherein the apparatus is configured to perform a method according to claim 1.

28. An object for lithography, wherein the object has been processed by a method of claim 1.

29. A method of lithographic processing of a semiconductor-based wafer, comprising:
lithographic transferring of a pattern associated with an object for lithography to the wafer, wherein the object has been processed by a method of claim 1.

30. A computer program comprising instructions which, when they are executed by a computer system, cause the computer system to perform a method according to claim 1.

* * * * *